United States Patent
Bodner et al.

(10) Patent No.: US 11,139,207 B2
(45) Date of Patent: Oct. 5, 2021

(54) METHOD FOR MANUFACTURING A SEMICONDUCTOR DEVICE AND SEMICONDUCTOR DEVICE

(71) Applicant: ams AG, Premstaetten (AT)

(72) Inventors: Thomas Bodner, Premstaetten (AT); Stefan Jessenig, Premstaetten (AT); Franz Schrank, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/754,323

(22) PCT Filed: Oct. 11, 2018

(86) PCT No.: PCT/EP2018/077743
§ 371 (c)(1),
(2) Date: Apr. 7, 2020

(87) PCT Pub. No.: WO2019/072970
PCT Pub. Date: Apr. 18, 2019

(65) Prior Publication Data
US 2020/0243387 A1    Jul. 30, 2020

(30) Foreign Application Priority Data
Oct. 12, 2017    (EP) .................................... 17196160

(51) Int. Cl.
*H01L 21/768* (2006.01)
*H01L 21/56* (2006.01)
*H01L 23/48* (2006.01)

(52) U.S. Cl.
CPC ........ *H01L 21/76898* (2013.01); *H01L 21/56* (2013.01); *H01L 23/481* (2013.01)

(58) Field of Classification Search
CPC .. H01L 21/76898; H01L 21/56; H01L 23/481
See application file for complete search history.

(56) References Cited

U.S. PATENT DOCUMENTS

| 7,402,515 B2 | 7/2008 | Arana et al. |
| 8,962,474 B2 | 2/2015 | Yu et al. |

(Continued)

FOREIGN PATENT DOCUMENTS

EP    2908337    8/2015

OTHER PUBLICATIONS

European Patent Office, International Search Report for PCT/EP/2018/077743 dated Dec. 13, 2018.

(Continued)

*Primary Examiner* — Herve-Louis Y Assouman
(74) *Attorney, Agent, or Firm* — MH2 Technology Law Group LLP

(57) ABSTRACT

A method for manufacturing a semiconductor device comprises the steps of providing a semiconductor body with a main plane of extension, and forming a trench in the semiconductor body from a top side of the semiconductor body in a vertical direction which is perpendicular to the main plane of extension of the semiconductor body. The method further comprises the steps of coating inner walls of the trench with an isolation layer, depositing a metallization layer within the trench, and depositing a passivation layer within the trench such that an inner volume of the trench is free of any material, wherein inner surfaces that are adjacent to the inner volume are treated to be hydrophobic at least in places. Furthermore, a semiconductor device is provided.

18 Claims, 3 Drawing Sheets

(56) References Cited

U.S. PATENT DOCUMENTS

| | | | | |
|---|---|---|---|---|
| 2008/0297880 A1* | 12/2008 | Steckl | ................. | G02B 26/004 359/291 |
| 2009/0140418 A1* | 6/2009 | Li | ..................... | H01L 23/53295 257/734 |
| 2011/0219612 A1 | 9/2011 | Jacquet et al. | | |
| 2014/0367862 A1* | 12/2014 | Kraft | .................... | H01L 21/743 257/774 |

OTHER PUBLICATIONS

Hong, L. et al.: "Surface microfluidics fabricated by photopatternable superhydrophobic anocomposite" Microfluidics and nanofluidics, 10(5), 991-997.

Kraft, J. et al.: "3D Sensor application with open through silicon via technology" Electronic Components and technology conference (ECTC), 2011 IEEE, (May 31, 2011), pp. 560-566.

Ryu, S.K. et al.: "Stress-Induced Delamination of Through Silicon via Structures" In E. Zschech, R. Radojcic, V. Sukharev, & L. Smith (Eds.), AIP Conference Proceedings (vol. 1378, No. 1, pp. 153-167). AIP.

Selvanayagam, C.S. et al.: "Nonlinear thermal stress/strain analyses of copper filled TSV (through silicon via) and their flip-chip microbumps" IEEE Transactions on Advanced Packaging, 32(4), 720-728.

Zhuang, L. et al.: "O2 plasma treatment in polymer insulation process for through silicon vias" In Electronic Packaging Technology (ICEPT) 2014 15$^{th}$ International Conference on (pp. 235-238). IEEE.

Zhuang, Y.X. et al.: "Wettability and thermal stability of fluorocarbon films deposited by deep reactive ion etching" Journal of Vacuum Science & Technology A: Vacuum, Surfaces, and Films, 23(3), 434-439.

Zhuang, Y.X. et al.: "Thermal stability of vapor phase deposited self-assembled monolayers for MEMS anti-stiction" Journal of Micromechanics and Microengineering, 16(11), 2259.

* cited by examiner

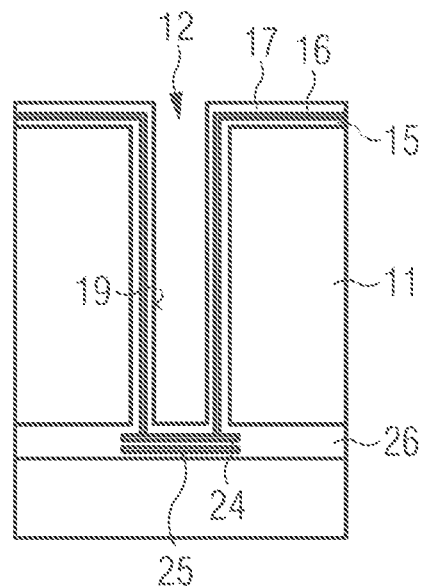
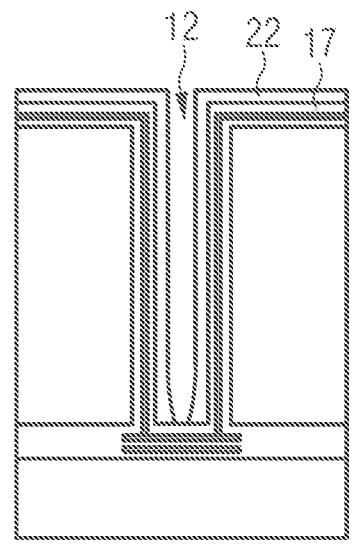
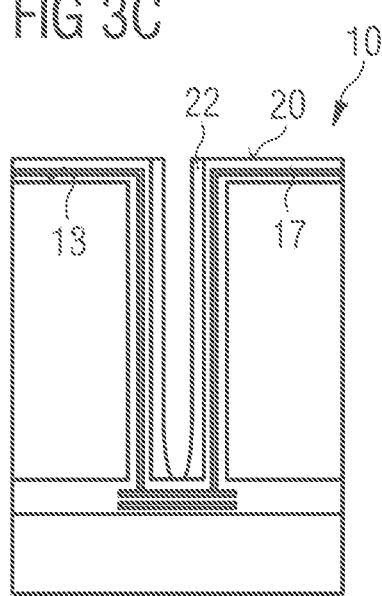

METHOD FOR MANUFACTURING A SEMICONDUCTOR DEVICE AND SEMICONDUCTOR DEVICE

CROSS-REFERENCE TO RELATED APPLICATIONS

The present application is the national stage entry of International Patent Application No. PCT/EP2018/077743, filed on Oct. 11, 2018, which claims the benefit of priority of European Patent Application No. 17196160.0, filed on Oct. 12, 2017, all of which are hereby incorporated by reference in their entirety for all purposes.

BACKGROUND OF THE INVENTION

In order to electrically contact an integrated circuit of a semiconductor device or another part of a semiconductor device, a common method is to form a through silicon via through the silicon substrate of the device. Therefore, a trench is formed in the substrate. The trench is at least partially filled with a metallization layer which is electrically isolated against the substrate. An integrated circuit which is arranged at a circuit side of the substrate can be electrically contacted via the through silicon via.

In order to attach the semiconductor device to a carrier or a wafer an underfill material can be arranged between the semiconductor device and the carrier. If the through silicon via is not completely filled with the metallization layer the underfill material can at least partially fill the through silicon via. Because of the different coefficients of thermal expansion of the underfill material and the materials of the through silicon via, stress can be induced within and around the through silicon via during processing. Therefore, some layers of the through silicon via can delaminate from each other and cracks can occur in the materials of the through silicon via. These cracks can lead to leakage currents or it is possible that dirt or humidity can enter the semiconductor device. Consequently, the efficiency and the lifetime of the semiconductor device can be decreased.

SUMMARY OF THE INVENTION

This disclosure provides a semiconductor device with an increased efficiency. This disclosure further provides a method for manufacturing an efficient semiconductor device.

According to at least one embodiment of the method for manufacturing a semiconductor device, the method comprises the step of providing a semiconductor body with a main plane of extension. The semiconductor body can be a substrate or a wafer. This means, the semiconductor body is a three-dimensional body and it can be a cuboid. The semiconductor body comprises a semiconductor material which can be, for example, silicon.

The method further comprises forming a trench in the semiconductor body from a top side of the semiconductor body in a vertical direction which is perpendicular to the main plane of extension of the semiconductor body. The trench can be formed by etching the material of the semiconductor body. At a bottom side of the trench that faces away from the top side of the semiconductor body an etch stop layer can be arranged. The etch stop layer can act as an etch stop for the etching of the trench. This means, the trench can extend from the top side of the semiconductor body towards the etch stop layer. The trench can have the shape of a cylinder. The diameter of the cylinder can for example amount to 40 µm or 80 µm.

The method further comprises coating inner walls of the trench with an isolation layer. The inner walls of the trench can extend in vertical direction. The isolation layer can comprise an electrically insulating material as for example silicon dioxide. The inner walls of the trench can be completely coated with the isolation layer. It is further possible that a bottom surface at the bottom side of the trench is coated with the isolation layer. The bottom surface of the trench can be completely coated with the isolation layer. After the deposition of the isolation layer, the isolation layer can be removed from the bottom surface of the trench.

The method further comprises depositing a metallization layer within the trench. The metallization layer can be deposited on top of the isolation layer. The metallization layer can be directly deposited on top of the isolation layer. This means, the metallization layer and the isolation layer can be in direct contact. Furthermore, the metallization layer can be deposited after the deposition of the isolation layer. The metallization layer can completely cover the isolation layer. In addition, the metallization layer can cover the bottom surface of the trench. This means for example that the metallization layer is in direct contact with the etch stop layer. The metallization layer does not completely fill the trench. This means, that a part of the trench is free of the metallization layer. The metallization layer can comprise an electrically conductive material as for example tungsten.

The method further comprises depositing a passivation layer within the trench such that an inner volume of the trench is free of any material, wherein inner surfaces that are adjacent to the inner volume are treated to be hydrophobic at least in places. It is also possible that the inner surfaces are treated to be superhydrophobic at least in places. The passivation layer can be deposited on top of the metallization layer. The passivation layer can be directly deposited on top of the metallization layer. This means, the passivation layer and the metallization layer can be in direct contact. Furthermore, the passivation layer can be deposited after the deposition of the metallization layer. The passivation layer can completely cover the metallization layer. This means, the passivation layer can cover the metallization layer at the inner walls of the trench and at the bottom surface.

After the deposition of the passivation layer the inner volume of the trench remains free of any material. This means, the inner volume of the trench is arranged between the inner walls in lateral directions which are parallel to the main plane of extension of the semiconductor body. In other words, the trench is not completely filled with material. This also means, that the trench is not completely filled with the isolation layer, the metallization layer and the passivation layer.

By depositing the isolation layer, the metallization layer and the passivation layer a through silicon via can be formed in the semiconductor body. As the inner volume of the trench remains free of any material the through silicon via can comprise inner surfaces that extend in vertical direction. The inner surfaces can be arranged within the trench. The inner surfaces can be the surfaces of the outermost layer which is deposited within the trench. The inner volume can be arranged between the inner surfaces in lateral directions. Furthermore, the inner volume and the inner surfaces can be in direct contact. The inner surfaces can be parallel to the inner walls of the trench.

That the inner surfaces are treated to be hydrophobic or superhydrophobic can mean that the inner surfaces are chemically modified such that they are hydrophobic or superhydrophobic at least in places. It is further possible that the inner surfaces are physically modified such that they are hydrophobic or superhydrophobic at least in places. In addition, it is possible that a material is applied to the inner surfaces in such a way that they are hydrophobic or superhydrophobic.

The inner surfaces can be treated from the top side of the trench. This means, that the inner surfaces can be hydrophobic at least close to the top side of the trench. For example, the inner surfaces can be treated to be hydrophobic at least in an upper region of the trench, where the upper region of the trench is close to or adjacent to the top side of the trench.

As the inner volume of the trench is free of any material, less material is required than for the case that the trench is completely filled with a material. Furthermore, less material of the metallization layer is required than for a trench completely filled with a metallization layer. The material of the metallization layer can have a coefficient of thermal expansion that is different from the coefficients of thermal expansion of the semiconductor body, the isolation layer and the passivation layer. Therefore, mechanical stress can be induced within and around the metallization layer during processing for example because of a change in temperature. Since the trench is not completely filled with the metallization layer, a smaller amount of the material of the metallization layer is arranged within the trench. Therefore, the stress induced during temperature changes is reduced and cracks can be avoided.

The inner surfaces are treated to be hydrophobic or superhydrophobic at least in places in order to reduce the surface energy or the wettability of the inner surfaces. If a carrier or a wafer is attached to the semiconductor body at the top side an underfill material can be used in order to connect the semiconductor body with the carrier. In some cases the underfill material can penetrate into the trench. It is further possible that the underfill material is in direct contact with the inner surfaces. However, as the inner surfaces are hydrophobic at least in places the adhesion between the inner surfaces and the underfill material is low. This means, no stiff connection is formed between the inner surfaces and the underfill material. The underfill material can have a coefficient of thermal expansion that is different from the coefficient of thermal expansion of the semiconductor body. Thus, the low adhesion between the inner surfaces and the underfill material can prevent the transfer of stress or strain from the underfill material to the materials of the through silicon via during temperature changes during processing. If for example the underfill material shrinks due to a decrease in temperature it can delaminate from the inner surfaces such that no or only a small amount of stress is transferred to the passivation layer and the metallization layer. Therefore, the formation of cracks in the metallization layer is avoided.

By avoiding the formation of cracks, the mechanical stability of the semiconductor device is increased. Therefore, the lifetime of the semiconductor device is increased and it can be operated more efficiently.

According to at least one embodiment of the method, the surface energy of a top surface at the top side amounts to at least 0.05 Joule per $m^2$. It is further possible that the surface energy of the top surface amounts to at least 0.07 Joule per $m^2$. The top surface is the surface of the semiconductor device at the top side of the semiconductor body. For example, the top surface can be the surface of the passivation layer at the top side. The surface energy of the top surface can be larger than the surface energy of the inner surfaces. This means, the inner surfaces are treated to be hydrophobic, but the top surface has a larger surface energy and is not hydrophobic or superhydrophobic. Furthermore, the contact angle of the top surface with water can amount to less than 30°. Therefore, if an underfill material is applied to connect the semiconductor body to a carrier, the underfill material can stick to the top surface. This means, the adhesion between the top surface and the underfill material is larger than the adhesion between the inner surfaces and the underfill material. Thus, a stable connection between the carrier and the semiconductor body can be formed.

According to at least one embodiment of the method, the surface energy of the inner surfaces amounts to less than 0.04 Joule per $m^2$. It is further possible that the surface energy of the inner surfaces amounts to less than 0.02 Joule per $m^2$. This means, the surface energy of the inner surfaces is relatively low. Therefore, materials as for example an underfill material exhibit a low adhesion to the inner surfaces. Furthermore, the inner surfaces can show an antistiction behavior. It is further possible that the contact angle of the inner surfaces with water amounts to at least 100°. The contact angle of the inner surfaces with water can also amount to at least 140°. Thus, because of the low surface energy of the inner surfaces a transfer of mechanical stress from the underfill material to the metallization layer is avoided or reduced.

According to at least one embodiment of the method, the inner surfaces are surfaces of the passivation layer facing away from the inner walls. This means, the passivation layer is the outermost layer within the trench. The surfaces of the passivation layer facing away from the underlying metallization layer form the inner surfaces. Consequently, the surfaces of the passivation layer are treated to be hydrophobic or superhydrophobic at least places. Advantageously, in this case no further layer is required in order to form inner surfaces that are hydrophobic or superhydrophobic at least in places.

According to at least one embodiment of the method, the surfaces of the passivation layer facing away from the inner walls are etched at least in places by an oxygen plasma. This means, the inner surfaces are etched at least in places by an oxygen plasma. By etching the surfaces of the passivation layer by an oxygen plasma the surfaces of the passivation layer can be chemically or physically modified. Advantageously, such a modified surface of the passivation layer can be more reactive to materials employed to render the inner surfaces hydrophobic during further processing steps.

According to at least one embodiment of the method, a photoresist is deposited at the top side. The photoresist can completely cover the top side of the semiconductor body. The photoresist can be deposited at the top side and above the trench. At next, the photoresist can be removed from the trench. The photoresist can be applied to protect the top surface at the top side while the inner surfaces are treated to be hydrophobic. The inner surfaces can be chemically or physically modified. During this processing step the top surface can be protected by the photoresist. In this way, the surface of the semiconductor body at the top side is not treated to be hydrophobic. Therefore, the top surface can exhibit a larger adhesion to an underfill material than the inner surfaces.

According to at least one embodiment of the method, after the deposition of the photoresist the surfaces of the passivation layer facing away from the inner walls are exposed to a silane in a solution or a carrier gas. This means, optionally the photoresist does not cover the surfaces of the passivation layer which can be the inner surfaces. It is further possible that the photoresist is removed from the surfaces of the passivation layer. While the surfaces of the passivation layer are exposed to a silane in a solution or a carrier gas, the top side can be covered by the photoresist.

In order to expose the surfaces of the passivation layer to a silane, a silane in a suitable solvent can be applied to the surfaces of the passivation layer which can be the inner surfaces. The silane can be for example a fluorinated silane as for example (heptadecafluoro-1,1,2,2-tetrahydrodecyl) trichlorosilane (FDTS). The solvent can be for example tetrahydrofuran (THF). The silane molecules can covalently bond to the surfaces of the passivation layer. For example the silane molecules can covalently bond to surface hydroxyl groups at the surfaces of the passivation layer. The fluorinated tale group of the silane molecules can reduce the surface energy of the surfaces of the passivation layer.

It is further possible that the surfaces of the passivation layer or the inner surfaces are exposed to a silane in a carrier gas, for example the surfaces of the passivation layer can be exposed to a silazane. The silazane can be for example hexamethyldisilazane or any other volatile silane that is able to react with surface hydroxyl groups such that the surface energy of the surfaces of the passivation layer can be reduced. This means, the surfaces of the passivation layer can be functionalized by the silane molecules. Advantageously, the silane molecules can be stably attached to the surfaces of the passivation layer up to a temperature of 400° C. Therefore, the surfaces of the passivation layer can be treated to be hydrophobic and to exhibit a low surface energy of less than 0.04 Joule per $m^2$ or less than 0.02 Joule per $m^2$. Furthermore, the contact angle of the surfaces of the passivation layer with water can amount to at least 100°. The chemical modification of the surfaces of the passivation layer can be stable during the following processing steps as for example during the deposition of an underfill material.

According to at least one embodiment of the method, a coating is deposited onto the passivation layer. The coating can be a layer of material deposited onto the passivation layer. It is further possible that the coating is a monolayer of material. The coating can cover the passivation layer at least in places. It is further possible that the coating completely covers the passivation layer. The coating can also be deposited at the top side of the semiconductor body. In this case no mask is required to deposit the coating onto the passivation layer. The coating can be employed to protect the passivation layer from an underfill material. In this case, if an underfill material is deposited at the top side the passivation layer is not in direct contact with the underfill material. Therefore, the metallization layer is further mechanically decoupled from the underfill material.

According to at least one embodiment of the method, the inner surfaces are surfaces of the coating facing away from the inner walls. This means, the coating is the outermost layer within the trench. The surfaces of the coating facing away from the underlying passivation layer form the inner surfaces. Consequently, the surfaces of the coating are treated to be hydrophobic or superhydrophobic at least places. Advantageously, the passivation layer is not required to comprise a material that can be functionalized or treated such that it is hydrophobic. Instead the coating can comprise a material which is hydrophobic or which can be treated to be hydrophobic.

Furthermore, the adhesion of the coating to the passivation layer can be low. In this way, stress induced by the underfill material is not completely transferred to the passivation layer and the metallization layer. It is further possible, that the coating delaminates from the passivation layer such that mechanical stress induced by the underfill material is decoupled from the passivation layer and the metallization layer.

According to at least one embodiment of the method, the coating is deposited via plasma polymerization. For example the coating can be deposited from a plasma in a deep reactive ion etching tool. A coating deposited in this way can show a very low surface energy. Therefore, by depositing the coating via plasma polymerization the inner surfaces can be modified to be hydrophobic or superhydrophobic. The coating can be removed from the top side by etching with an oxygen plasma.

According to at least one embodiment of the method, the coating comprises a fluoropolymer. The coating can for example be deposited from a fluoropolymer, for example $C_4F_8$, plasma in a deep reactive ion etching tool. This means, the fluoropolymer molecules can bond to the passivation layer and form the coating. A coating deposited in this way can show a very low surface energy.

According to at least one embodiment of the method, the coating comprises nanoparticles. The coating can comprise a photoresist, as for example SU-8, in which nanoparticles can be incorporated. The nanoparticles can be for example plasma-functionalized polytetrafluoroethylene (PTFE) nanoparticles. The photoresist with the nanoparticles can be deposited within the trench via spray coating. The photoresist with the nanoparticles can be removed from the top surface by photolithography. A coating comprising nanoparticles can have a very low surface energy as for example less than 0.025 Joule per $m^2$ and it can exhibit an anti-stiction behavior. The contact angle of a coating comprising nanoparticles can amount to at least 150°. Furthermore, a coating comprising nanoparticles can be superhydrophobic.

Furthermore, a semiconductor device is provided. The semiconductor device can optionally be produced by means of one of the methods described here. This means all features disclosed for the method for manufacturing a semiconductor device are also disclosed for the semiconductor device and vice-versa.

In at least one embodiment of the semiconductor device, the semiconductor device comprises a semiconductor body with a main plane of extension. The semiconductor body can comprise silicon.

The semiconductor device further comprises a trench that extends through at least a part of the semiconductor body in a vertical direction from a top side of the semiconductor body, where the vertical direction is perpendicular to the main plane of extension of the semiconductor body. The trench can be formed by etching the semiconductor body. The trench can comprise a bottom surface arranged at the side facing away from the top side.

The semiconductor device further comprises an isolation layer covering at least partially inner walls of the trench. The isolation layer can completely cover the inner walls of the trench. The bottom surface can be free of the isolation layer. The isolation layer can comprise an electrically insulating material.

The semiconductor device further comprises a metallization layer covering at least partially the isolation layer. The metallization layer can completely cover the isolation layer and the bottom surface. The isolation layer can electrically isolate the metallization layer from the semiconductor body. The metallization layer can comprise an electrically conductive material.

The semiconductor device further comprises a passivation layer covering at least partially the metallization layer. The passivation layer can completely cover the metallization layer.

Furthermore, an inner volume of the trench is free of any material, and inner surfaces that are adjacent to the inner volume are hydrophobic at least in places. It is also possible that the inner surfaces are superhydrophobic at least in places. This means, the inner volume is free of the isolation layer, the metallization layer and the passivation layer. Furthermore, the inner volume of the trench is free of any other material. That the inner surfaces are hydrophobic at least in places means that they can have a low adhesion to other materials. The inner surfaces can be hydrophobic completely. It is further possible, that the inner surfaces are hydrophobic close to the top side of the trench.

The trench with the layers arranged within the trench can form a through silicon via. That means, that the metallization layer can be electrically connected with an electrical contact at the top side of the semiconductor body. Furthermore, the metallization layer can be electrically connected with an electrically conductive contact pad at the side of the trench that faces away from the top side. Therefore, another part of the semiconductor device, for example an integrated circuit connected with the contact pad, can be electrically contacted at the electrical contact at the top side.

The volume of the trench is free of any material in order to mechanically stabilize the trench with the layers. The metallization layer and the other layers in the semiconductor body can have different coefficients of thermal expansion. Therefore, mechanical stress can be induced within and around the metallization layer during different temperature steps during processing. In order to reduce the mechanical stress and in order to avoid the formation of cracks the trench is not completely filled with an electrically conductive material. Furthermore, in this way less material is required.

The inner surfaces are hydrophobic at least in places in order to further improve the mechanical stability of the trench with the layers. If a carrier or a wafer is attached to the semiconductor body at the top side an underfill material can be used in order to connect the semiconductor body with the carrier. In some cases the underfill material can penetrate into the trench. It is further possible that the underfill material is in direct contact with the inner surfaces. However, as the inner surfaces are hydrophobic at least in places the adhesion between the inner surfaces and the underfill material is low. The underfill material can have a coefficient of thermal expansion that is different from the coefficient of thermal expansion of the semiconductor body. Thus, the low adhesion between the inner surfaces and the underfill material can prevent the transfer of stress or strain from the underfill material to the materials of the through silicon via during temperature changes during processing. If for example the underfill material shrinks due to a decrease in temperature it can delaminate from the inner surfaces such that no or only a small amount of stress is transferred to the passivation layer and the metallization layer. Therefore, the formation of cracks in the metallization layer is avoided.

By mechanically stabilizing the through silicon via or the trench with the different layers the lifetime of the semiconductor device is increased. Therefore, the semiconductor device can be operated more efficiently.

In at least one embodiment of the semiconductor device, the surface energy of a top surface at the top side amounts to at least 0.05 Joule per $m^2$. It is further possible that the surface energy of the top surface amounts to at least 0.07 Joule per $m^2$. The top surface is the surface of the semiconductor device at the top side of the semiconductor body. The surface energy of the top surface can be larger than the surface energy of the inner surfaces. Therefore, if an underfill material is applied to connect the semiconductor body to a carrier, the underfill material can stick to the top surface. This means, the adhesion between the top surface and the underfill material is larger than the adhesion between the inner surfaces and the underfill material. Thus, a stable connection between the carrier and the semiconductor body can be formed.

In at least one embodiment of the semiconductor device, a coating covers the passivation layer. The coating can completely cover the passivation layer. It is further possible that the coating covers the passivation layer only in places. For example, the coating can cover the passivation layer in a region within the trench close to the top side. The coating can be a monolayer. The surfaces of the coating facing away from the passivation layer can be the inner surfaces of the trench. Therefore, the surfaces of the coating can be hydrophobic. By employing a coating the passivation layer is not required to have a hydrophobic surface. Instead it is possible to employ a coating which is hydrophobic or which can be treated to be hydrophobic.

In at least one embodiment of the semiconductor device, the metallization layer is electrically connected with an integrated circuit of the semiconductor device. The metallization layer can be electrically connected with the integrated circuit via the etch stop layer. The integrated circuit can be arranged at the side of the trench facing away from the top side. It is further possible that the integrated circuit is arranged next to the trench in lateral directions. The integrated circuit can be electrically connected to an electrical contact at the top side via the metallization layer. Thus, the metallization layer arranged within the trench enables that the integrated circuit can be electrically contacted at the top side.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

With FIGS. 1A, 1B, 1C, 1D, 1E and 1F an embodiment of the method for manufacturing a semiconductor device is described.

Figure 2A:
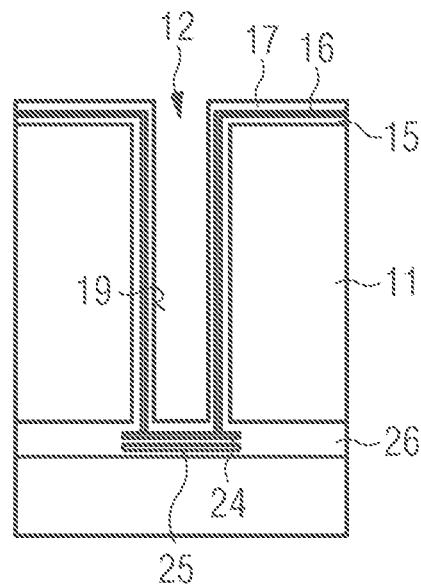
Figure 2B:
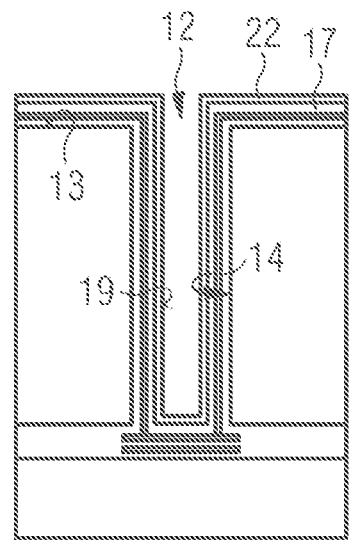
Figure 2C:
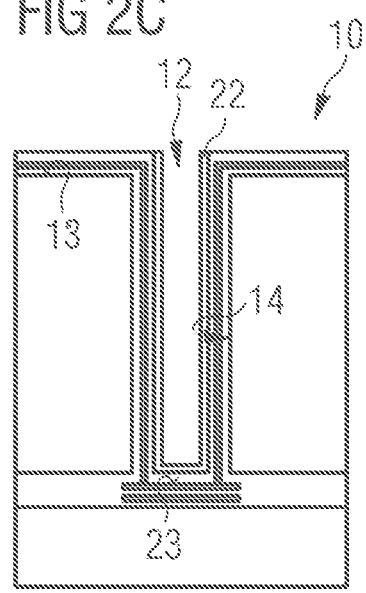

With FIGS. 2A, 2B and 2C a further embodiment of the method for manufacturing a semiconductor device is described.

With FIGS. 3A, 3B and 3C a further embodiment of the method for manufacturing a semiconductor device is described.

DETAILED DESCRIPTION

Figure 1A:
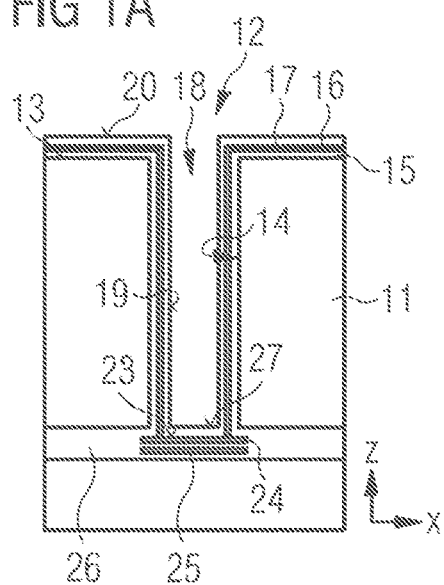

In FIG. 1A a cutaway view of a semiconductor body 11 is shown. In a first step of the method for manufacturing a semiconductor device 10, a semiconductor body 11 with a main plane of extension is provided. The semiconductor body 11 can comprise silicon. At next, a trench 12 is formed in the semiconductor body 11 from a top side 13 of the semiconductor body 11 in a vertical direction z which is perpendicular to the main plane of extension of the semiconductor body 11. The trench 12 comprises inner walls 14 which extend in vertical direction z. At a bottom side 23 of the trench 12 facing away from the top side 13 an electrically conductive etch stop layer 24 is arranged. This means, the etch stop layer 24 forms a bottom surface 27 of the trench 12. The lateral extent of the etch stop layer 24 is larger than the lateral extent of the trench 12, where the lateral extent is given in a lateral direction x which is parallel to the main plane of extension of the semiconductor body 11. The etch stop layer 24 extends in a plane which is parallel to the main plane of extension of the semiconductor body 11. The etch stop layer 24 is arranged between a contact pad 25 and the trench 12 in vertical direction z. The contact pad 25 can comprise an electrically conductive material and it has the same lateral extent as the etch stop layer 24. The etch stop layer 24 and the contact pad 25 can be electrically connected with each other. Furthermore, the etch stop layer 24 and the contact pad 25 can be electrically connected with an integrated circuit of the semiconductor device 10 which is not shown. The etch stop layer 24 and the contact pad 25 are each surrounded by an isolation material 26. The isolation material 26 can be electrically insulating.

In a next step of the method the inner walls 14 of the trench 12 are coated with an isolation layer 15. The isolation layer 15 completely covers the inner walls 14. Furthermore, the isolation layer 15 covers the top side 13 of the semiconductor body 11. At the bottom surface 27 of the trench 12 the isolation layer 15 is removed again after its deposition. The isolation layer 15 comprises an electrically insulating material.

In a next step of the method a metallization layer 16 is deposited within the trench 12. The metallization layer 16 completely covers the isolation layer 15 and the bottom surface 27 of the trench 12. Therefore, the metallization layer 16 is in direct contact with the etch stop layer 24. The metallization layer 16 comprises an electrically conductive material.

In a next step of the method a passivation layer 17 is deposited within the trench 12 such that an inner volume 18 of the trench 12 is free of any material. The passivation layer 17 completely covers the metallization layer 16. After the deposition of the passivation layer 17 the trench 12 is not completely filled with the materials of the isolation layer 15, the metallization layer 16 and the passivation layer 17. The surfaces of the passivation layer 17 that are facing away from the inner walls 14 form inner surfaces 19. The inner surfaces 19 are adjacent to the inner volume 18.

Figure 1B:
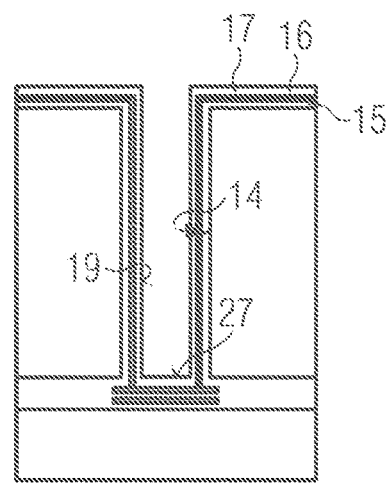

With FIG. 1B a next step of the method is described. The surfaces of the passivation layer 17 facing away from the inner walls 14 and the bottom surface 27 are etched by an oxygen plasma. This means, the inner surfaces 19 are etched by an oxygen plasma. By etching the surfaces of the passivation layer 17 by an oxygen plasma the surfaces of the passivation layer 17 can be chemically or physically modified. Advantageously, such modified surfaces of the passivation layer 17 are more reactive to materials employed to render the inner surfaces 19 hydrophobic during further processing steps.

Figure 1C:
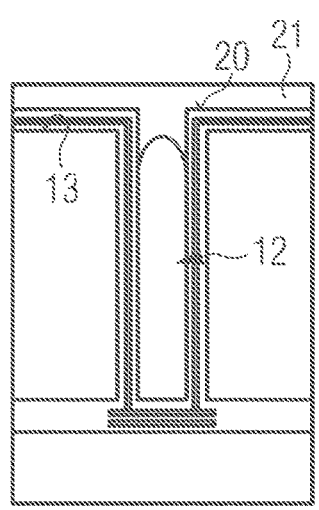

In FIG. 1C it is shown that in a next step of the method a photoresist 21 is applied at the top side 13 above the trench 12. This means, a top surface 20 at the top side 13 is coated with the photoresist 21. The photoresist 21 can partially penetrate into the trench 12.

Figure 1D:
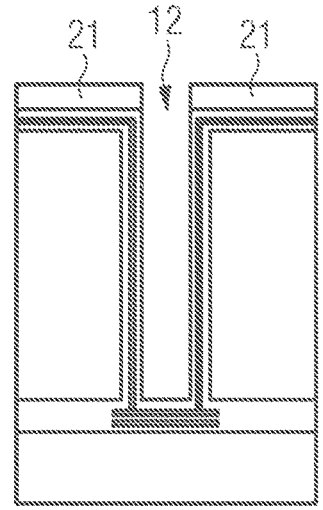

In a next step of the method, as shown in FIG. 1D, the photoresist 21 is exposed to electromagnetic radiation and developed such that the photoresist 21 is removed above the trench 12.

Figure 1E:
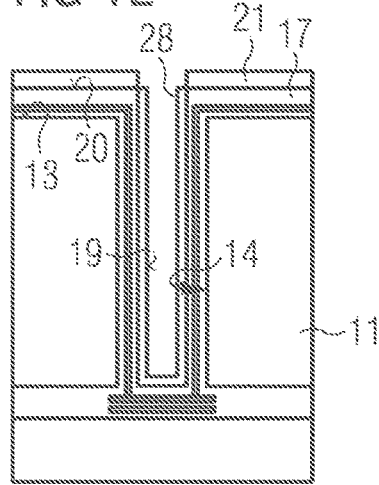

In FIG. 1E it is shown that the surfaces of the passivation layer 17 facing away from the inner walls 14 are exposed to a silane in a solution or a carrier gas. This means, the inner surfaces 19 are exposed to a silane in a solution or a carrier gas. In order to expose the surfaces of the passivation layer 17 to a silane, a silane in a suitable solvent can be applied to the surfaces of the passivation layer 17. The silane can be for example a fluorinated silane as for example (heptadecafluoro-1,1,2,2-tetrahydrodecyl)trichlorosilane (FDTS). The solvent can be for example tetrahydrofuran (THF). The silane molecules can covalently bond to the surfaces of the passivation layer 17 forming a surface functionalization 28. For example the silane molecules can covalently bond to surface hydroxyl groups at the surfaces of the passivation layer 17. The fluorinated tale group of the silane molecules can reduce the surface energy of the surfaces of the passivation layer 17.

It is further possible that the surfaces of the passivation layer 17 or the inner surfaces 19 are exposed to a silane in a carrier gas, as for example a silazane. The silazane can be for example hexamethyldisilazane or any other volatile silane that is able to react with surface hydroxyl groups such that the surface energy of the surfaces of the passivation layer 17 can be reduced and that a surface functionalization 28 is formed. This means, the surfaces of the passivation layer 17 can be chemically functionalized by the silane molecules. After the surface functionalization the inner surfaces 19 are hydrophobic. Furthermore, the surface energy of the inner surfaces 19 can amount to less than 0.04 Joule per m$^2$. The contact angle of the surfaces of the passivation layer with water can amount to at least 100°. The chemical modification of the surfaces of the passivation layer 17 can be stable during the following processing steps as for example during the deposition of an underfill material.

While the surfaces of the passivation layer 17 are modified the top surface 20 is protected by the photoresist 21 such that the top surface 20 is not chemically modified. In this way, the surface of the semiconductor body 11 at the top side 13 is not treated to be hydrophobic. Therefore, the top surface 20 can exhibit a larger adhesion to an underfill material than the inner surfaces 19.

Figure 1F:
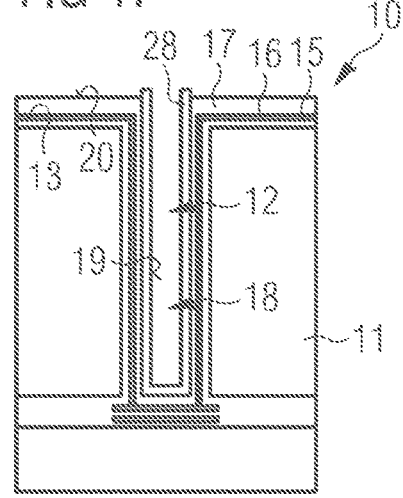

In FIG. 1F it is shown that the photoresist 21 is removed by a solvent from the top surface 20 after the surface functionalization of the inner surfaces 19. The surface energy of the top surface 20 can amount to at least 0.05 Joule per m$^2$ such that an underfill material can easily stick to the top surface 20.

With FIG. 1F it is further shown that a semiconductor device 10 can be manufactured by the method described herein. Therefore, an embodiment of a semiconductor device 10 is shown in FIG. 1F. The semiconductor device 10 comprises a semiconductor body 11 with a main plane of extension. The semiconductor device 10 further comprises a trench 12 that extends through at least a part of the semiconductor body 11 in vertical direction z from the top side 13 of the semiconductor body 11. An isolation layer 15 covers the inner walls 14 of the trench 12 and a metallization layer 16 covers the isolation layer 15. Furthermore, a passivation layer 17 covers the metallization layer 16 and an inner volume 18 of the trench 12 is free of any material. Additionally, inner surfaces 19 that are adjacent to the inner volume 18 are hydrophobic.

With FIGS. 2A, 2B and 2C a further embodiment of the method for manufacturing a semiconductor device 10 is described. In FIG. 2A, as a first step of the method, the same setup as shown in FIG. 1A is depicted.

FIG. 2B shows that a coating 22 is deposited on the passivation layer 17. The coating 22 covers the passivation layer 17 within the trench 12 and at the top side 13. In this case the inner surfaces 19 are surfaces of the coating 22 facing away from the inner walls 14. The coating 22 is deposited via plasma polymerization. The coating 22 can for example be deposited from a fluoropolymer, for example $C_4F_8$, plasma in a deep reactive ion etching tool. This means, the fluoropolymer molecules can bond to the passivation layer 17 and form the coating 22. The coating 22 shows a very low surface energy of less than 0.04 Joule per $m^2$ and is therefore hydrophobic.

With FIG. 2C it is shown that the coating 22 is removed from the top side 13 with an oxygen plasma. If the lateral extent of the trench 12 increases from the top side 13 towards the bottom side 23 no mask is required for removing the coating 22 from the top side 13. In this case the coating 22 remains within the trench 12 because of the shape of the inner walls 14 of the trench 12. If the lateral extent of the trench 12 increases from the top side 13 towards the bottom side 23, the inner walls 14 are inclined and prevent the coating 22 from being removed by the oxygen plasma. Thus, the coating 22 remains within the trench 12 where the inner surfaces 19 are hydrophobic.

With FIGS. 3A, 3B and 3C a further embodiment of the method for manufacturing a semiconductor device 10 is described. In FIG. 3A, as a first step of the method, the same setup as shown in FIG. 1A is depicted.

In FIG. 3B it is shown that in a next step of the method a coating 22 is deposited onto the passivation layer 17. The coating 22 comprises a photoresist, as for example SU-8, in which nanoparticles are incorporated. The nanoparticles can be for example plasma-functionalized polytetrafluoroethylene (PTFE) nanoparticles. The photoresist with the nanoparticles is deposited within the trench 12 via spray coating. A coating 22 comprising nanoparticles can have a very low surface energy of less than 0.02 Joule per $m^2$ and it can exhibit an anti-stiction behavior. The contact angle of the coating 22 with water can amount to at least 140°. Furthermore, a coating 22 comprising nanoparticles can be superhydrophobic. The surface energy of the coating 22 can be adapted by changing the material of the nanoparticles and/or the size distribution.

With FIG. 3C it is shown that the coating 22 is removed from the top side 13 by photolithography. Therefore, the top surface 20 is not superhydrophobic and an underfill material can stick to the top surface 20.

The invention claimed is:

1. A method for manufacturing a semiconductor device, the method comprising:
   providing a semiconductor body with a main plane of extension,
   forming a trench in the semiconductor body from a top side of the semiconductor body in a vertical direction which is perpendicular to the main plane of extension of the semiconductor body,
   coating inner walls of the trench with an isolation layer,
   depositing a metallization layer on the isolation layer within the trench, and
   depositing a passivation layer on the metallization layer within the trench such that an inner volume of the trench is free of any material, and
   wherein inner surfaces that are adjacent to the inner volume are treated to be hydrophobic at least in places.

2. The method according to claim 1, wherein the inner surfaces are in contact with or exposed to the inner volume.

3. The method according to claim 1, wherein the surface energy of a top surface at the top side amounts to at least 0.05 Joule per $m^2$.

4. The method according to claim 1, wherein the surface energy of the inner surfaces amounts to less than 0.04 Joule per $m^2$.

5. The method according to claim 1, wherein the inner surfaces are surfaces of the passivation layer facing away from the inner walls.

6. The method according to claim 1, wherein the surfaces of the passivation layer facing away from the inner walls are etched at least in places by an oxygen plasma.

7. The method according to claim 1, wherein a photoresist is deposited at the top side.

8. The method according to claim 7, wherein after the deposition of the photoresist the surfaces of the passivation layer facing away from the inner walls are treated, in particular treated to be hydrophobic, by exposure to a silane in a solution or a carrier gas.

9. The method according to claim 1, wherein a hydrophobic coating is deposited onto the passivation layer.

10. The method according to claim 9, wherein the inner surfaces are surfaces of the hydrophobic coating facing away from the inner walls.

11. The method according to claim 9, wherein the hydrophobic coating is deposited via plasma polymerization.

12. The method according to claim 9, wherein the hydrophobic coating comprises a fluoropolymer.

13. The method according to claim 9, wherein the hydrophobic coating comprises nanoparticles.

14. A semiconductor device comprising:
   a semiconductor body with a main plane of extension,
   a trench that extends through at least a part of the semiconductor body in a vertical direction from a top side of the semiconductor body, where the vertical direction is perpendicular to the main plane of extension of the semiconductor body,
   an isolation layer covering at least partially inner walls of the trench,
   a metallization layer covering at least partially the isolation layer, and
   a passivation layer covering at least partially the metallization layer, wherein
   an inner volume of the trench is free of any material, and one or more inner surfaces adjacent to the inner volume are hydrophobic at least in places.

15. The semiconductor device according to claim 14, wherein the inner surfaces are in contact with or exposed to the inner volume.

16. The semiconductor device according to claim 14, wherein the surface energy of a top surface at the top side amounts to at least 0.05 Joule per $m^2$.

17. The semiconductor device according to claim 14, wherein a hydrophobic coating covers the passivation layer.

18. The semiconductor device according to claim 14, wherein the metallization layer is electrically connected with an integrated circuit of the semiconductor device.

* * * * *